(12) United States Patent
Yang et al.

(10) Patent No.: US 10,079,273 B2
(45) Date of Patent: Sep. 18, 2018

(54) ORGANIC LIGHT-EMITTING DISPLAY DEVICE

(71) Applicant: LG Display Co., Ltd., Seoul (KR)

(72) Inventors: Hee-Jung Yang, Gyeonggi-do (KR); Woo-Sup Shin, Gyeonggi-do (KR); Gyu-Won Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/596,305

(22) Filed: May 16, 2017

(65) Prior Publication Data
US 2018/0033841 A1 Feb. 1, 2018

(30) Foreign Application Priority Data
Jul. 29, 2016 (KR) ........................ 10-2016-0097546

(51) Int. Cl.
| | | |
|---|---|---|
| *H01L 27/32* | (2006.01) | |
| *H01L 51/00* | (2006.01) | |
| *H01L 51/52* | (2006.01) | |
| *H01L 51/50* | (2006.01) | |

(52) U.S. Cl.
CPC ...... *H01L 27/3246* (2013.01); *H01L 27/3272* (2013.01); *H01L 51/0003* (2013.01); *H01L 51/5218* (2013.01); *H01L 51/5253* (2013.01); *H01L 51/5012* (2013.01); *H01L 2251/308* (2013.01); *H01L 2251/5315* (2013.01)

(58) Field of Classification Search
CPC ............ H01L 27/3246; H01L 27/3272; H01L 51/0003; H01L 51/5218; H01L 51/5253; H01L 2251/5315
See application file for complete search history.

(56) References Cited

U.S. PATENT DOCUMENTS

| | | | | |
|---|---|---|---|---|
| 2011/0198597 A1* | 8/2011 | Antonenkov | ....... | H01L 51/5228 257/59 |
| 2012/0267611 A1* | 10/2012 | Chung | ................ | H01L 27/3211 257/40 |
| 2013/0099218 A1* | 4/2013 | Lee | .................... | H01L 51/5203 257/40 |
| 2015/0097171 A1* | 4/2015 | Kim | ..................... | H01L 27/3246 257/40 |
| 2016/0006001 A1* | 1/2016 | Lee | ........................ | C23C 14/042 438/35 |
| 2016/0093827 A1* | 3/2016 | Han | .................... | H01L 51/5246 257/40 |
| 2016/0190225 A1* | 6/2016 | Kim | ..................... | H01L 27/3276 257/40 |
| 2017/0092863 A1* | 3/2017 | Bower | ................ | H01L 51/0013 |
| 2017/0123543 A1* | 5/2017 | Choi | ..................... | G06F 3/0412 |
| 2017/0186823 A1* | 6/2017 | Kim | ................... | H01L 27/3213 |
| 2017/0186831 A1* | 6/2017 | Nam | ................... | H01L 27/3272 |
| 2017/0317154 A1* | 11/2017 | Heo | ..................... | H01L 27/3211 |

* cited by examiner

*Primary Examiner* — Mohsen Ahmadi

(74) *Attorney, Agent, or Firm* — Morgan, Lewis & Bockius LLP

(57) ABSTRACT

An organic light-emitting display device protects a first electrode and reduces any effect due to light leakage from the top or the peripheral side of a bank, thereby increasing lifespan. The organic light-emitting display device includes a first electrode protective pattern.

10 Claims, 9 Drawing Sheets

ORGANIC LIGHT-EMITTING DISPLAY DEVICE

This application claims the benefit of Korean Patent Application No. 10-2016-0097546, filed on Jul. 29, 2016, which is hereby incorporated by reference as if fully set forth herein.

BACKGROUND

Technical Field

The present disclosure relates to an organic light-emitting display device, and more particularly, to an organic light-emitting display device with reduced current leakage and increased lifespan.

Discussion of the Related Art

With the advent of the information age, the field of displays that visually display electrically conveyed information signals has rapidly been developed. In response, various flat panel display devices having excellent performance, such as thinner and lighter designs and less power consumption, have been developed and are rapidly replacing conventional cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, an organic light-emitting display device is considered to be a competitive application because it requires no separate light source and realizes device compactness and vivid color display.

Such an organic light-emitting display device includes self-luminous elements, such as organic light-emitting diodes, provided in sub-pixels, and performs display via operation of the organic light-emitting diodes on a per sub-pixel basis. In addition, the organic light-emitting diodes may be used as self-luminous elements in a lighting apparatus as well as the display device, and thus the development of organic light-emitting diodes has recently been in the spotlight in the lighting industry. In addition, because the organic light-emitting diodes require no separate light source unit, they are also advantageously used in a flexible display device or a transparent display device.

Meanwhile, such an organic light-emitting diode includes an organic light-emitting layer between two electrodes. In addition, electrons and holes are respectively injected into the organic light-emitting layer from the two electrodes, and excitons are produced in the organic light-emitting layer via combination of the electrons and holes. Then, when the produced excitons fall down from the excited state to the ground state, light is generated from the organic light-emitting diode.

FIG. 1 is a cross-sectional view illustrating an organic light-emitting display device according to an embodiment of the related art.

As illustrated in FIG. 1, the organic light-emitting display device according to an embodiment of the related art includes a first electrode 20 located in each sub-pixel on a substrate 10, a bank 30 located at the boundary of the sub-pixel to expose an emission area, an organic light-emitting layer 40 provided in the emission area, and a second electrode 50 disposed on the organic light-emitting layer 40.

In the above-described configuration, however, when the bank 30 has a low height, the organic light-emitting layer 40 may cover the bank 30 without distinction between different areas when the organic light-emitting layer 140 is formed via a solution process. In this case, lateral light leakage may occur.

In addition, the height of the bank 30 formed via an exposure process is generally insufficient.

Therefore, an example of forming the bank 30 in a dual form is suggested.

FIG. 2 is a cross-sectional view illustrating an organic light-emitting display device according to another embodiment of the related art.

As illustrated in FIG. 2, the organic light-emitting display device according to another embodiment of the related art includes a bank having a dual structure, which includes a first bank 32 configured to delimit an emission area and a second bank 35 provided on the first bank 32 to have a predetermined height.

Despite such a bank having a dual structure, however, the area in which the bank is provided does not appear as a substantially available emission area regardless of whether the display device is of a top-emission type or a bottom-emission type. In addition, due to a stepped portion of the bank, an organic layer including the organic light-emitting layer 40 may excessively accumulate in the area in which the bank is provided, which causes current leakage in the corresponding area. Therefore, sufficient lifespan of the organic light-emitting display device may not be achieved.

In particular, when the organic light-emitting layer 40 is formed via a solution process in order to reduce the number of mask processes, the accumulation of the organic layer may be further worsened, thus resulting in lifespan reduction. Therefore, the application of the solution process may be impossible.

In addition, a hillock may be generated on the side of the first electrode 20 because two bank photo processes need to be performed on the corner of the first electrode 20. In addition, any constituent material of the first electrode 20 may react with the first bank 32 during deposition of the first and second banks 32 and 35, thus being crystallized or damaged.

SUMMARY

Accordingly, embodiments of the present disclosure are directed to an organic light-emitting display device that substantially obviates one or more problems due to limitations and disadvantages of the related art.

An aspect of the present disclosure is to provide an organic light-emitting display device that protects a first electrode and reduces any effect due to light leakage from the top or the peripheral side of a bank, thereby improving lifespan.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, an organic light-emitting display device protects a first electrode and reduces any effect due to light leakage from the top or the peripheral side of a bank through the provision of a first electrode protective pattern, thereby improving lifespan.

In accordance with one aspect of the present disclosure, an organic light-emitting display device comprises a substrate having a plurality of sub-pixels, first electrodes provided respectively in the sub-pixels, a first electrode protective pattern provided on an edge of each of the first electrodes to be in contact with the first electrode, a bank configured to overlap a portion of the first electrode protective pattern so as to define an emission area, an organic light-emitting layer on the first electrode so as to correspond to the emission area, and a second electrode on the organic light-emitting layer.

Here, a region of the bank that overlaps the portion of the first electrode may be located on the first electrode protective pattern.

Meanwhile, the first electrode protective pattern may be directly located only on the edge of the first electrode, or the first electrode protective pattern may be directly located on a top and a side of the edge of the first electrode.

In some cases, the first electrode protective pattern may extend from the side of the edge of the first electrode so that an area between the first electrodes of the neighboring sub-pixels is filled with the first electrode protective pattern. In this case, the first electrode protective pattern may be formed of an oxide semiconductor material.

The first electrode protective pattern may comprise two layers including a metal layer and a transparent metal oxide layer, or may be formed of an oxide semiconductor material.

When the first electrode protective pattern comprises two layers including a metal layer and a transparent oxide layer, the metal layer may be selected from Mo, Ti, Ta, an alloy of any one thereof, or a MoTi alloy.

The first electrode protective pattern may overlap the first electrode further inward than the bank.

The bank may be provided so that an area between the first electrodes of the neighboring sub-pixels is filled with the bank.

Meanwhile, the bank may include a first layer configured to overlap a portion of the first electrode so that the area between the first electrodes of the neighboring sub-pixels is filled with the first layer, and a second layer provided on the first layer so as to correspond to the area between the first electrodes of the neighboring sub-pixels.

In some cases, the first electrode protective pattern may be located only on a top of the edge of the first electrode, and may be in contact with a bottom of the first layer.

Meanwhile, the first layer or the second layer may be a light-shielding insulating material, or the first layer may be a hydrophilic insulating material and the second layer may be a hydrophobic insulating material.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
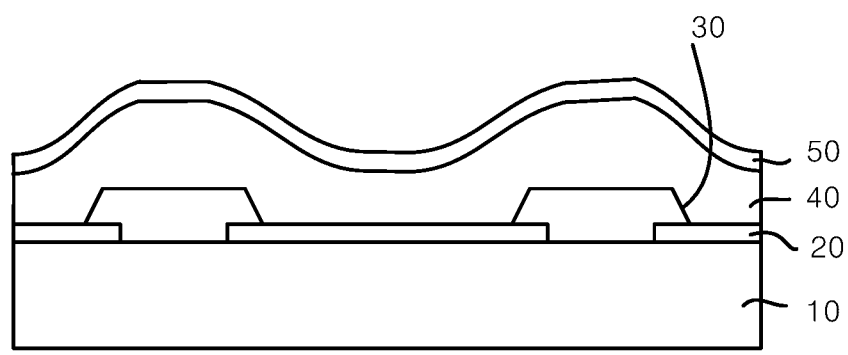
FIG. 1 is a cross-sectional view illustrating an organic light-emitting display device according to an embodiment of the related art.
Figure 2:
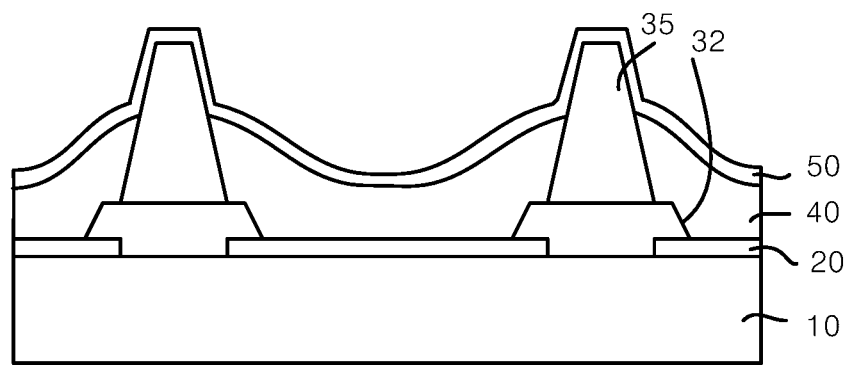
FIG. 2 is a cross-sectional view illustrating an organic light-emitting display device according to another embodiment of the related art.

Advantages and features of embodiments of the present disclosure and the way of attaining them will become apparent with reference to the following description in detail in conjunction with the accompanying drawings. The present invention, however, is not limited to the embodiments disclosed hereinafter and may be embodied in many different forms. Rather, these exemplary embodiments are provided so that this disclosure will be through and complete and will fully convey the scope to those skilled in the art. Thus, the scope of the present disclosure should be defined by the claims.

The shapes, sizes, ratios, angles, numbers, and the like, which are illustrated in the drawings in order to describe various embodiments of the present invention, are merely given by way of example, and therefore, the present invention is not limited to the illustrations in the drawings. The same or extremely similar elements are designated by the same reference numerals throughout the specification. In addition, in the description of the present invention, a detailed description of related known technologies will be omitted when it may make the subject matter of the present invention rather unclear. In the present specification, when the terms "comprises", "includes", and the like are used, other elements may be added unless the term "only" is used. An element described in the singular form is intended to include a plurality of elements unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkage and driving thereof are possible. These various embodiments may be performed independently of each other, or may be performed in association with each other.

First Embodiment

Figure 3:
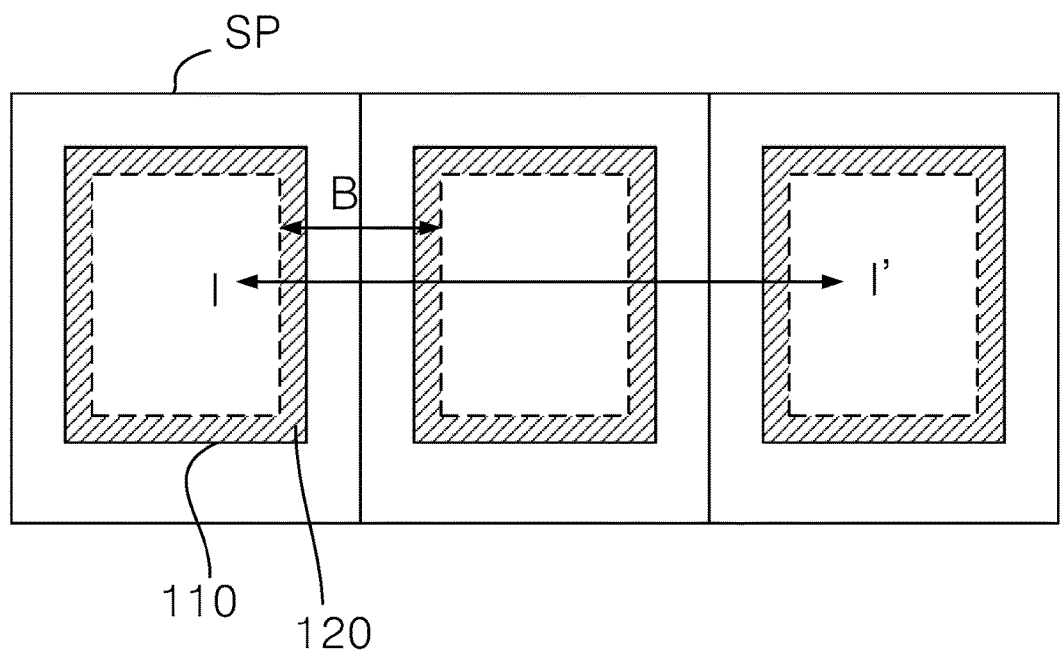
FIG. 3 is a plan view illustrating an organic light-emitting display device according to a first embodiment of the present invention.
Figure 4:
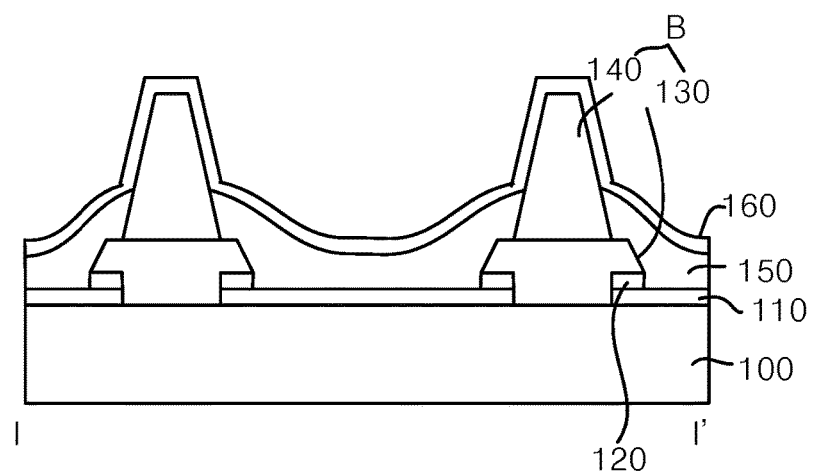
FIG. 4 is a cross-sectional view taken along line I-I' of FIG. 3 illustrating the organic light-emitting display device according to the first embodiment of the present invention.

FIG. 3 is a plan view illustrating an organic light-emitting display device according to a first embodiment of the present invention, and FIG. 4 is a cross-sectional view taken along line I-I' of FIG. 3 illustrating the organic light-emitting display device according to the first embodiment of the present invention.

As illustrated in FIGS. 3 and 4, the organic light-emitting display device of the present invention includes a substrate 100 having a plurality of sub-pixels SP, first electrodes 110 provided in respective sub-pixels SP, a first electrode protective pattern 120 provided on the edge of each first electrode 110 so as to be in contact with the first electrode 110, a bank B configured to overlap a portion of each first electrode 110 so as to define an emission area, an organic light-emitting layer 150 disposed on the first electrodes 110 so as to correspond to the emission area, and a second electrode 160 disposed on the organic light-emitting layer 150.

Here, the bank B, which overlaps the first electrode 110, is disposed on the top of the first electrode protective pattern 120. Because the bank B is provided after the first electrode protective pattern 120 covers the first electrode 110, any abnormal reaction between the bank B and the first electrode 110 may be prevented.

According to the first embodiment of the present invention, the bank B includes a first layer 130, which overlaps a portion of the first electrode 110 so that the area between the neighboring first electrodes 110 is filled with the first layer 130, and a second layer 140, which is provided on the first layer 130 so as to correspond to the top of the area between the neighboring first electrodes 110. The first layer 130 may be formed of a hydrophilic material, such as, for example, SiO$_2$, and the second layer 140 may be formed of a hydrophobic material, such as benzo-cyclo-butene (BCB) or polyimide.

In this case, the second layer 140 having a hydrophobic property may push an organic light-emitting material when the organic light-emitting layer 150 is formed, thereby allowing the organic light-emitting layer 150 to be uniformly distributed and applied to the periphery of the second layer 140 and the emission area. That is, a reduced amount of the organic light-emitting layer 150 accumulates on the first layer 130 compared to the structure of the related art, which may prevent light leakage and lifespan reduction.

In addition, the first electrode protective pattern 120 is provided immediately before the first layer 130 is formed, which may prevent degeneration of the first electrode 110 during deposition of the first layer 130, which is formed of a hydrophilic material.

In some cases, any one of the first layer 130 and the second layer 140, which constitute the bank B, may be a light-shielding black bank. In this case, the entire non-emission area may be covered with the black bank, and optical interference between the neighboring sub-pixels may be prevented.

Meanwhile, the first electrode protective pattern 120 may be formed in two layers including a metal layer and a transparent metal oxide layer, or may be formed in a single layer formed of an oxide semiconductor material.

When the first electrode protective pattern 120 is formed in two layers including the metal layer and the transparent oxide layer, the metal layer is formed of a light-shielding metal. For example, the metal may be Mo, Ti, Ta, an alloy of any one of them, or a MoTi alloy. In addition, the transparent oxide layer may be formed of MoOx, TiOx, or TaOx, may be oxidized to have transparency, and may have higher dielectric permittivity than metals, thereby preventing light leakage due to current leakage in the area in which the first electrode protective pattern 120 is formed owing to the insulation property thereof.

When the first electrode protective pattern 120 is formed of an oxide semiconductor material, such as indium gallium zinc oxide (IGZO), the first electrode protective pattern 120 may be formed in a single layer. In addition, the oxide semiconductor material may increase the content of oxygen to thereby maintain the insulation property of the entire first electrode protective pattern 120, thereby preventing current leakage and light leakage from the edge of the first electrode 110.

Meanwhile, although the organic light-emitting layer 150 may include only a single organic light-emitting layer, the organic light-emitting layer 150 may include an additional organic layer, such as a hole injection layer/hole transport layer, or an electron transport layer/electron injection layer, above and below the organic light-emitting layer. This layered structure may be selectively applied in order to optimize the efficiency of an organic light-emitting diode provided in each sub-pixel on the substrate 100. In addition, the hole injection layer/hole transport layer or the electron transport layer/electron injection layer may be deposited as a common layer on the entire surface without a mask, or may be formed via a solution process. In addition, the layered structure of the organic light-emitting layer may be equally applied to other embodiments, which will be described below.

Modification of First Embodiment

Figure 5:
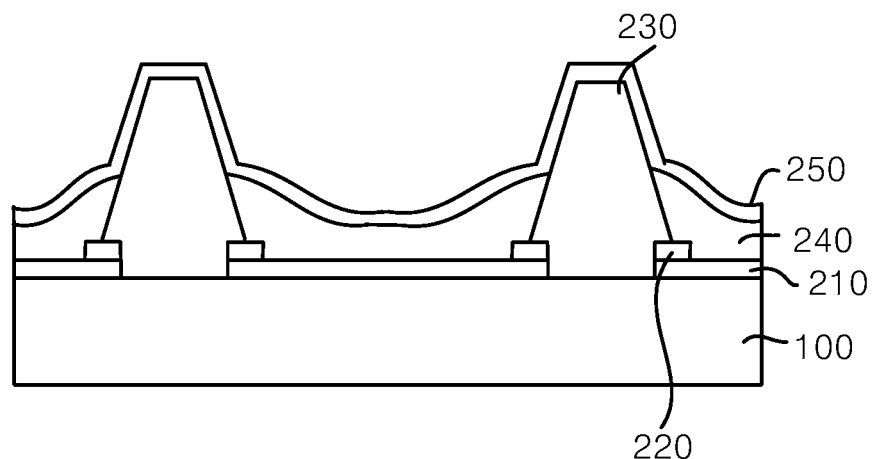
FIG. 5 is a cross-sectional view taken along line I-I' of FIG. 3 illustrating an organic light-emitting display device according to a modification of the first embodiment of the present invention.

FIG. 5 is a cross-sectional view taken along line I-I' of FIG. 3 illustrating the organic light-emitting display device according to a modification of the first embodiment of the present invention.

FIG. 5 illustrates a modification of the first embodiment in which a bank 230 is formed of a single material having a hydrophobic insulating property, unlike the above-described first embodiment.

In this case, a first electrode protective pattern 220 is located only on the edge of a first electrode 210, in the same manner as the above-described first embodiment.

After the first electrode protective pattern 220 is formed, the bank 230, which is formed of a hydrophobic insulating material overlaps a portion of the first electrode protective pattern 220 so that the area between the neighboring first electrodes 210 is filled with the bank 230. Subsequently, an organic light-emitting layer 240 is applied via a solution process. The organic light-emitting layer 240 is applied at a small thickness on the top of the first electrode protective pattern 220 due to the repulsion of the hydrophobic bank 230. In addition, light emission does not occur in the area in which the first electrode protective pattern 220 is located because of the light-shielding or insulation property of the first electrode protective pattern 220, which may prevent light leakage and lifespan reduction.

Figure 6A:
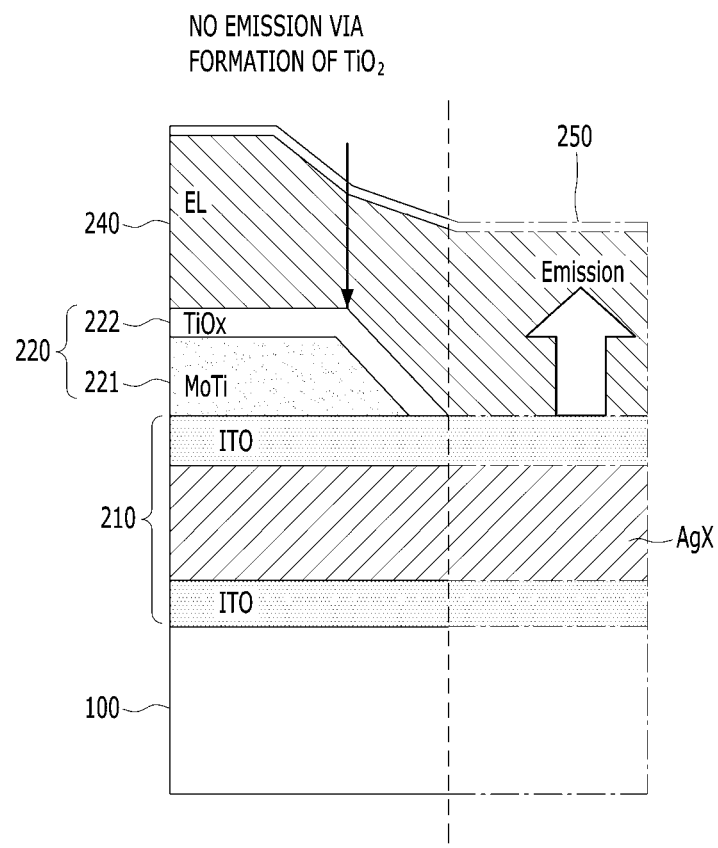
FIGS. 6A and 6B are cross-sectional views illustrating a first electrode of FIG. 5 on an enlarged scale.
Figure 6B:
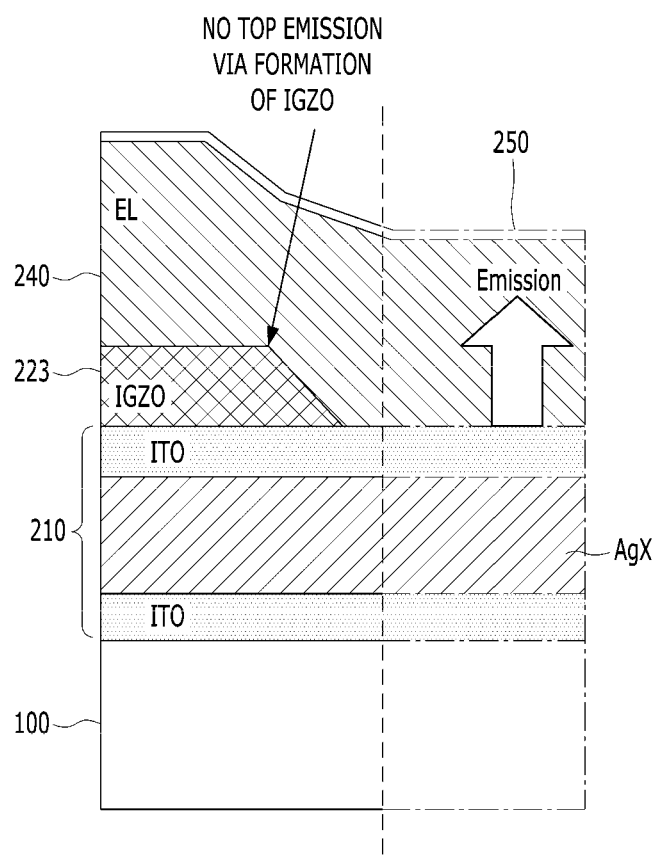

FIGS. 6A and 6B are cross-sectional views illustrating the corner of the first electrode of FIG. 5 on an enlarged scale.

FIGS. 6A and 6B illustrate that the first electrode 210 is formed in triple layers of ITO/AgX/ITO. The first electrode protective pattern 220 may have a dual structure including a light-shielding metal layer 221 and a transparent oxide layer 222 as illustrated in FIG. 6A, or may include an oxide semiconductor layer 223 as illustrated in FIG. 6B.

In both cases, no light emission occurs in the area in which the first electrode protective pattern 220 is formed due to the insulation property of the transparent oxide layer 222 and the insulation property of the oxide semiconductor layer 223. Thereby, light leakage and current leakage caused by the organic light-emitting layer 240 on the corner of the first electrode 210 may be prevented, and consequently, lifespan reduction may be prevented.

Meanwhile, the triple structure of the above-described first electrode 210 is given by way of example under the assumption that the display device is of a top-emission type and that AgX serves as a reflective electrode. AgX may be omitted when the display device is of a bottom-emission type. The present invention is not limited to the illustrated example, and may be applied to other metal structures so long as they include the first electrode protective pattern of the present invention.

Meanwhile, when the first electrode includes a transparent conductive layer formed of, for example, indium tin oxide (ITO), crystallization may occur due to a deposition temperature during the subsequent deposition process, which causes non-uniformity and poor mobility of the first electrode. Therefore, the first electrode protective pattern of the present invention may be more effective when the first electrode includes a material that is vulnerable to high-temperature deposition, such as ITO.

Meanwhile, although the above-described first embodiment illustrates the example in which the first electrode protective pattern is provided only on the edge of the first electrode, the present invention is not limited thereto.

Hereinafter, an example of expanding the first electrode protective pattern will be described via other embodiments.

Second Embodiment

Figure 7:
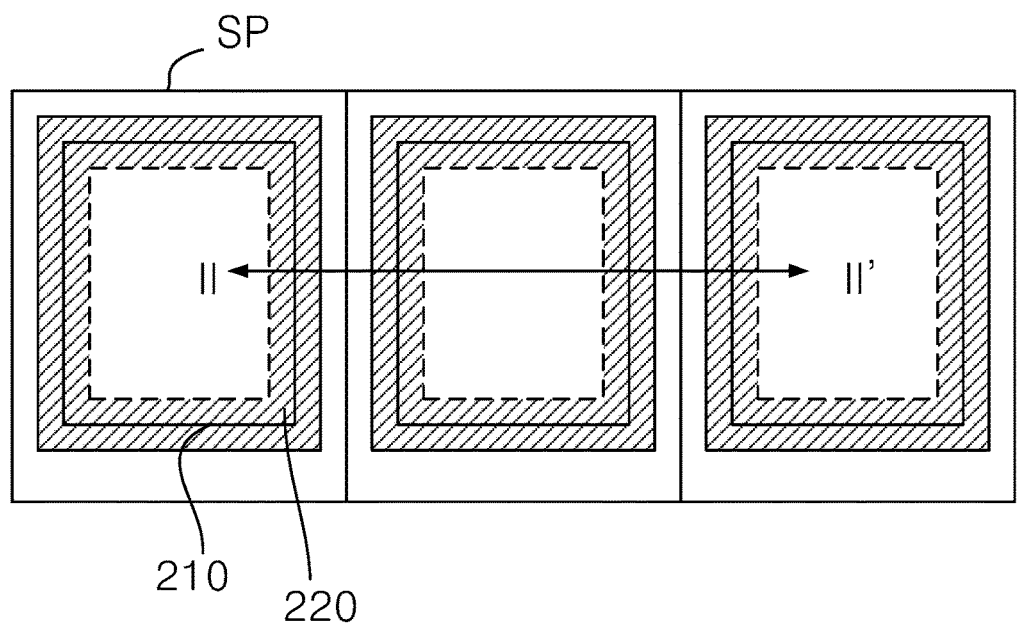
FIG. 7 is a plan view illustrating an organic light-emitting display device according to a second embodiment of the present invention.
Figure 8:
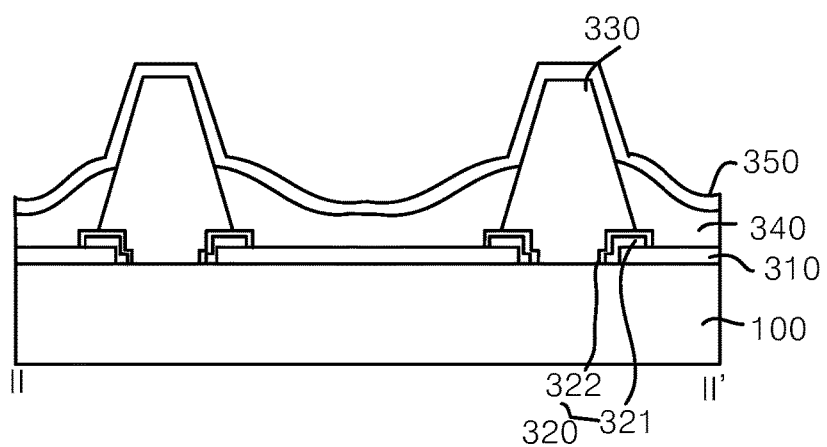
FIG. 8 is a cross-sectional view taken along line II-II' of FIG. 7.

FIG. 7 is a plan view illustrating an organic light-emitting display device according to a second embodiment of the present invention, and FIG. 8 is a cross-sectional view taken along line II-II' of FIG. 7.

As illustrated in FIGS. 7 and 8, the first electrode protective pattern 320 is located on the top and the side of the edge of the first electrode 310.

In this case, because the first electrode protective pattern 320 functions to protect the first electrode 310 and to prevent light emission, the width of a bank 330 may be further reduced compared to the above-described example. That is, the bank 330 may be located only in the area between the neighboring first electrodes 310 so as to overlap only the first electrode protective pattern 320 without overlapping the first electrode 310. In this case, the first electrode protective pattern 320 may overlap the first electrode 310 further inward than the bank 330.

FIG. 8 illustrates an example in which the first electrode protective pattern 320 includes a light-shielding metal layer 321 and a transparent oxide layer 322 covering the metal layer 321.

In this case, an organic light-emitting layer 350, which is formed after the bank 330 is formed, is uniformly applied to the top of the first electrode 310 and the top of the first electrode protective pattern 320, which similarly have a hydrophilic property. However, the organic light-emitting material, which is in the form of a solution, is pushed on the top of the bank 330 having a hydrophobic property, thereby being applied so as to be in contact with only a portion of the side of the bank 330.

At this time, even if a small amount of the organic light-emitting layer 350 accumulates on the corner of the first electrode 310, light emission in the corresponding area is prevented by the provision of the first electrode protective pattern 320, which may prevent lifespan reduction caused by deterioration of the edge of the organic light-emitting layer.

Modification of Second Embodiment

Figure 9:
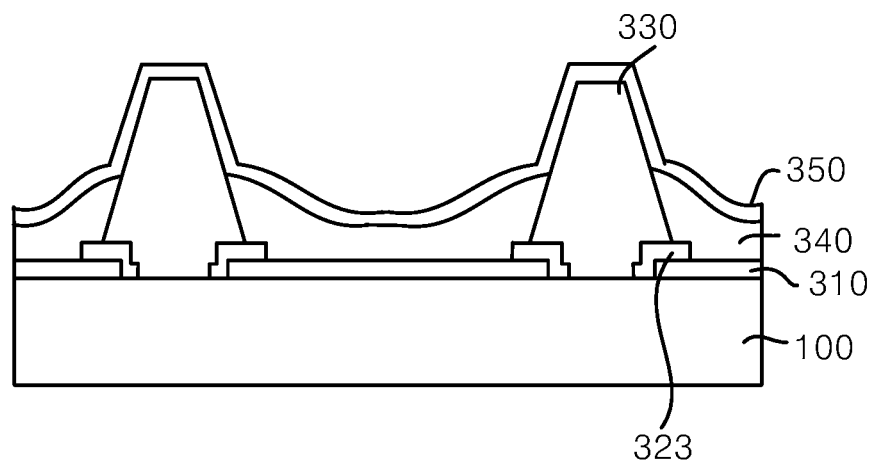
FIG. 9 is a cross-sectional view taken along line II-II' of FIG. 7 according to a modification of the second embodiment of the present invention.

FIG. 9 is a cross-sectional view taken along line II-II' of FIG. 7 according to a modification of the second embodiment of the present invention.

In the modification of the second embodiment illustrated in FIG. 9, the first electrode protective pattern takes the form of a single layer including an oxide semiconductor layer 323, unlike the above-described second embodiment. In the same manner as the above-described second embodiment, deterioration of the organic light-emitting layer located on the corner of the first electrode 310, and lifespan reduction due to this deterioration may be prevented.

Third Embodiment

Figure 10:
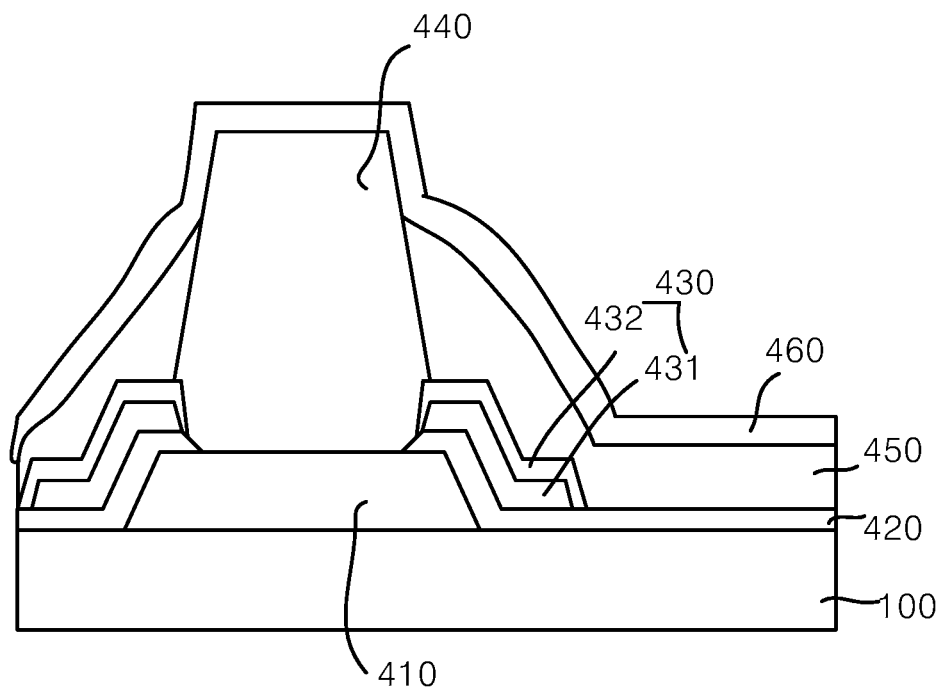
FIG. 10 is a cross-sectional view illustrating an organic light-emitting display device according to a third embodiment of the present invention.

FIG. 10 is a cross-sectional view illustrating an organic light-emitting display device according to a third embodiment of the present invention.

As illustrated in FIG. 10, the organic light-emitting display device according to the third embodiment of the present invention includes a black bank 410, which is a first layer of a bank B, a first electrode 420, a portion of which overlaps the edge of the black bank 410, a first electrode protective pattern 430, which is provided on the first electrode 420 overlapping the blank bank 410, and a hydrophobic bank 440, which is a second layer of the bank B and is disposed on the black bank 410 so as to overlap a portion of the first electrode protective pattern 430.

The above-described structure may more surely prevent light leakage from the edge of the first electrode 420 owing to the dual structure of the black bank 410 and the first electrode protective pattern 430.

According to the illustrated example, although the first electrode protective pattern 430 has a dual layer structure including a light-shielding metal layer 431 and a transparent oxide layer 432, the present invention is not limited thereto, and the first electrode protective pattern 430 may derive the same function when it is replaced with the above-described single semiconductor oxide layer.

In addition, in the above-described example, the first electrode 420 is disposed on the upper side of the black bank 410, which forms a portion of the bank B, such that the formation sequence of the first electrode 420 and the bank B is exchanged. In this case, the light-shielding black bank 410 is formed first, and the first electrode 420 and the first electrode protective pattern 430 are formed thereafter. As such, even if the light-shielding black bank 410 is formed via deposition, this has no effect on the formation of the first electrode 420. Therefore, degeneration of the first electrode 420 upon deposition may be prevented even if the first electrode 420 substantially does not include the first electrode protective pattern 430.

Here, although not described, reference numeral 450 designates an organic light-emitting layer, and reference numeral 460 designates a second electrode.

In some cases, the first electrode protective pattern may extend laterally from the edge of the first electrode so that the area between the first electrodes of the neighboring sub pixels may be filled with the first electrode protective pattern. In this case, the first electrode protective pattern may be formed of an oxide semiconductor material.

The area between the neighboring first electrodes may be filled with the bank.

Meanwhile, the bank may include a first layer, a portion of which overlaps the first electrode so that the area between the neighboring first electrodes is filled with the first layer, and a second layer, which is provided on the first layer so as to correspond to the top of the area between the neighboring first electrodes.

In some cases, the first electrode protective pattern may be located only on the top of the edge of the first electrode, and may be in contact with the bottom of the first layer of the bank.

Meanwhile, the first layer or the second layer of the bank may be formed of a light-shielding insulating material, or the first layer may be formed of a hydrophilic insulating material and the second layer may be formed of a hydrophobic insulating material.

Fourth Embodiment

Figure 11:
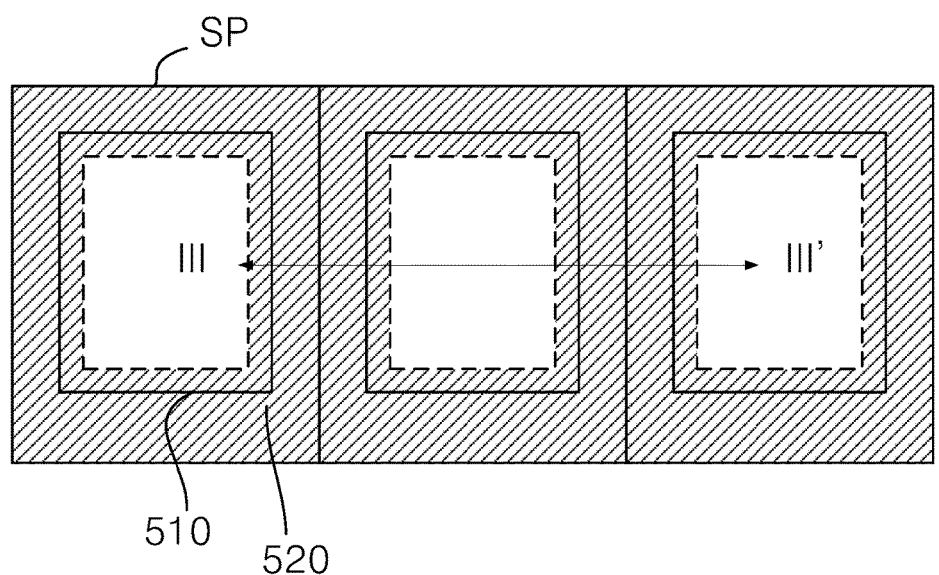
FIG. 11 is a plan view illustrating an organic light-emitting display device according to a fourth embodiment of the present invention.
Figure 12:
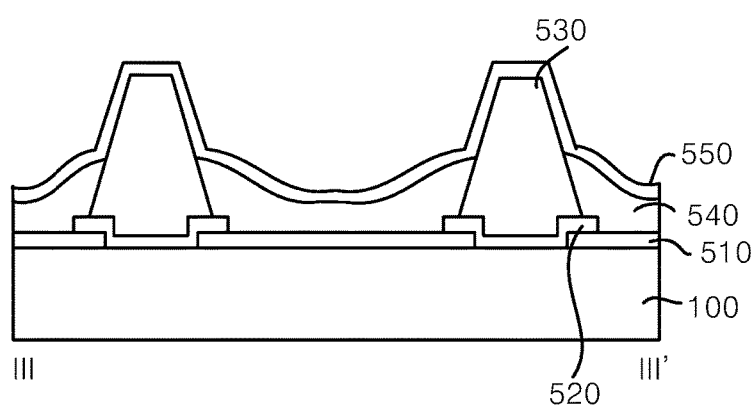
FIG. 12 is a cross-sectional view taken along line III-III' of FIG. 11.

FIG. 11 is a plan view illustrating an organic light-emitting display device according to a fourth embodiment of the present invention, and FIG. 12 is a cross-sectional view taken along line III-III' of FIG. 11.

As illustrated in FIGS. 11 and 12, the organic light-emitting display device according to the fourth embodiment of the present invention illustrates an example in which a first electrode protective pattern 520 is provided not only on the edge of a first electrode 510, but also in a non-emission area. In this case, the entire first electrode protective pattern 520 may be formed of an oxide semiconductor material having an insulation property. This serves to prevent electrical short-circuit between the neighboring first electrodes 510. In addition, the fourth embodiment may be applied to both the first embodiment in which the bank includes the first and second layers and the second embodiment in which the bank includes a single hydrophobic material.

Here, although not described, reference numeral 530 designates a bank, reference numeral 540 designates an organic light-emitting layer, and reference numeral 550 designates a second electrode.

Meanwhile, the substrate 100, which has been described in the above-described embodiment, may be a glass substrate or a flexible insulating plastic substrate. In addition, the substrate 100 may be a single insulating substrate, and may include a driving thin-film transistor corresponding to each sub-pixel. When the substrate 100 includes the driving thin-film transistor, the first electrode may be formed so as to be connected to the driving thin-film transistor, and the driving thin-film transistor may be formed with an organic flat layer for the purpose of protection, excluding a connection hole for the first electrode.

In the embodiments of the present invention described above, the substrate 100 is a single insulating substrate, and includes a driving thin-film transistor in each sub-pixel so that an organic flat layer is provided on the top of the driving thin-film transistor, excluding a first electrode connection hole.

Hereinafter, a method of manufacturing the organic light-emitting display device of the present invention will be described in brief. The reason why the method is described is to illustrate that the first electrode protective pattern protects an organic light-emitting layer formed via a solution process.

Manufacturing Method

FIGS. 13A to 13D are process cross-sectional views illustrating a method of manufacturing the organic light-emitting display device according to the first embodiment of the present invention.

Figure 13A:
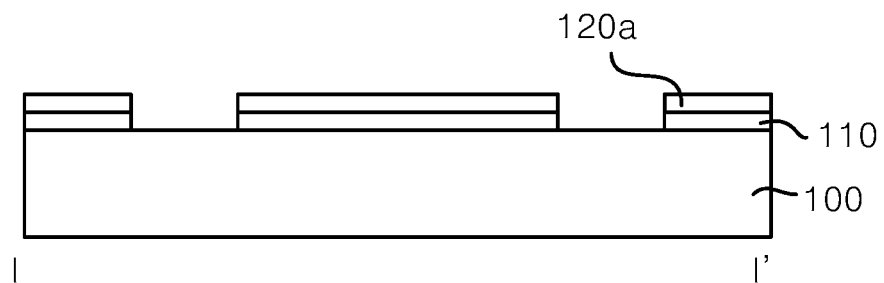
FIGS. 13A to 13D are process cross-sectional views illustrating a method of manufacturing the organic light-emitting display device according to the first embodiment of the present invention.

To manufacture the organic light-emitting display device according to the first embodiment of the present invention, first, a first electrode formation material (the same layer as reference numeral 110) and a first electrode protective material 120a are sequentially deposited on the substrate 100, and then are selectively removed so that the first electrode 110 and the first electrode protective material 120a, which are the same width, remain in each sub-pixel of the substrate 100, as illustrated in FIG. 13A.

As described above, the first electrode 110 may be a single layer formed of a transparent conductive material, such as ITO, or may include a plurality of layers including a transparent conductive layer and a reflective metal layer.

In addition, the first electrode protective material 120a may be two layers including a light-shielding metal layer and a transparent oxide layer, as illustrated in FIG. 6A, or may be a single layer including an oxide semiconductor layer, as illustrated in FIG. 6B.

Figure 13B:
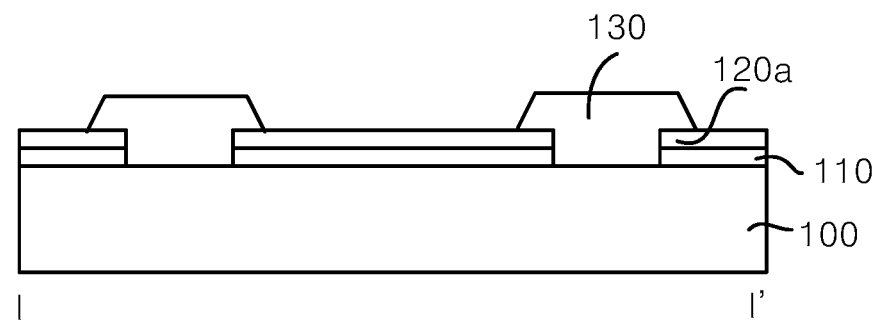

Subsequently, as illustrated in FIG. 13B, a first layer 130 is formed on the edge of the first electrode and in the area between the neighboring first electrodes 110. The first layer 130 may be a thin hydrophilic inorganic layer formed of $SiO_2$. Even if the temperature of deposition of the inorganic layer exceeds 30017, as illustrated in FIG. 13B, the first electrode protective material 120a may remain on the entire first electrode 110 during deposition, thereby protecting the first electrode 110, which is vulnerable to heat.

Figure 13C:
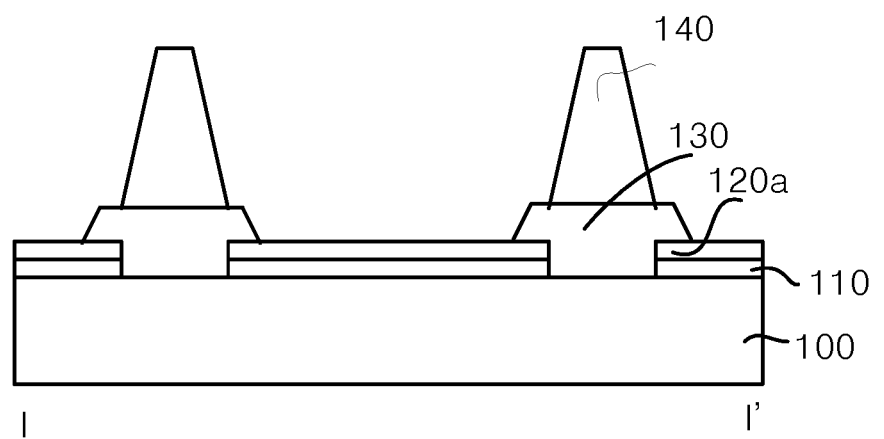

Subsequently, as illustrated in FIG. 13C, a second layer 140 in the form of a hydrophobic insulating layer is formed on the first layer 130 so as to correspond to the area between the neighboring first electrodes 110. The hydrophobic insulating layer may be formed of an organic material, such as, for example, BCB, polyimide, or polyamide.

In this process, the first electrode protective material 120*a* remains on the first electrode 110, thereby protecting the first electrode 110 during deposition, application, exposure, and developing processes for the formation of the second layer 140.

Figure 13D:
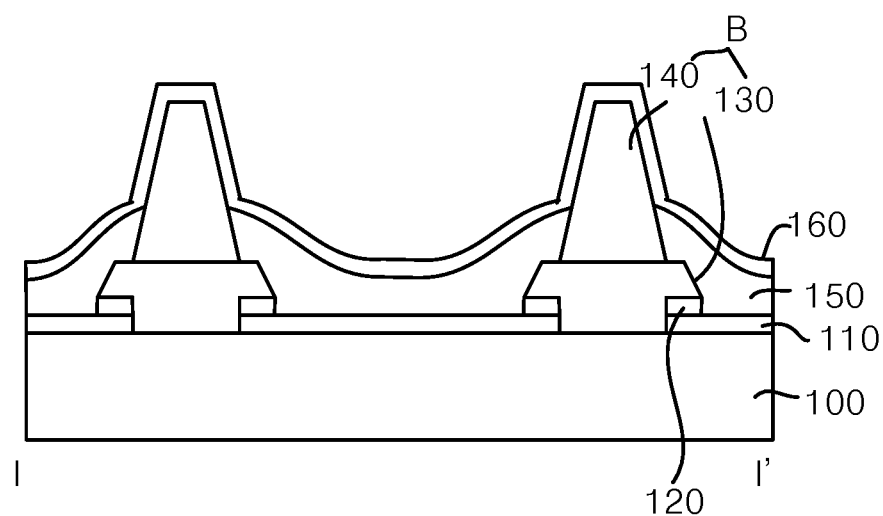

Subsequently, as illustrated in FIG. 13D, the exposed first electrode protective material 120*a* is removed using the first layer 130 as a mask so that only the first electrode protective pattern 120 below the first layer 130 remains.

Subsequently, an organic light-emitting material, which is in the form of a solution, is applied to sufficiently cover an emission area, and is cured to allow the organic light-emitting layer 150 to remain. At this time, although the organic light-emitting layer 150 remains in the emission area and on the exposed top of the first layer 130 and the side of the second layer 140, the first electrode protective pattern 120 may prevent light leakage from the edge of the first electrode 110, thereby preventing deterioration of the first electrode 110.

In addition, the second electrode 160 is deposited on the top of the organic light-emitting layer 150. In this case, because the second electrode 160 is deposited via, for example, sputtering, which ensures good straightness of a metal material, the second electrode 160 is also deposited on the top and the side of the second layer 140 as well as the top of the organic light-emitting layer 150 so as to be commonly formed on the entire substrate 100 without requiring distinction of the sub-pixels.

As described above, in the method of manufacturing the organic light-emitting display device of the present invention, after the first electrode protective pattern material 120*a* is formed on the first electrode 110, the first electrode protective pattern material 120*a* protects the top of the first electrode 110 in the subsequent bank-forming process. Accordingly, degeneration of the first electrode 110 due to the presence of a bank material may be prevented even if the first electrode 110 is exposed to a high-temperature during deposition.

Thereafter, the first electrode protective pattern 120, which remains on the edge of the first electrode 110, prevents light leakage from the edge of the first electrode 110, thereby preventing lifespan reduction.

Meanwhile, in the modification of the first embodiment or in the second to fourth embodiments, the first electrode protective pattern commonly functions to protect the first electrode and to prevent light leakage from the edge of the first electrode, as described above. Although the number of layers may be reduced or increased between the embodiments, the first electrode protective pattern, which comes into contact with the first electrode, is commonly applied to achieve the effect of the present invention, and therefore, a description of the manufacturing method thereof is omitted.

As is apparent from the above description, according to the present invention, an organic light-emitting display device according to the present invention has the following effects.

First, although a first electrode may be crystallized when it meets a bank material that needs to be deposited at a high temperature, thus attaining uneven mobility or forming a hillock on the side thereof, the present invention solves this problem by applying a first electrode protective pattern on the edge of the first electrode. That is, the first electrode protective pattern may be formed to cover the top and the edge of the first electrode, thus giving thermal stability to the first electrode and preventing a reaction between the first electrode and the bank material.

Second, when the first electrode protective pattern includes a light-shielding material or an insulating material, light leakage or lifespan reduction due to the accumulation of an organic light-emitting layer on the bank edge may be prevented.

Third, by solving any problem related to the accumulation of the organic light-emitting layer on the bank edge, when an organic light-emitting layer is formed via a solution process, an emission area may be defined using a bank including a single organic material, instead of a bank in the form of two layers, which may result in a simplified structure.

It will be apparent to those skilled in the art that various modifications and variations can be made in the organic light-emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
    a substrate having a plurality of sub-pixels;
    first electrodes provided respectively in the sub-pixels;
    a first electrode protective pattern provided on an edge of each of the first electrodes and to be in contact with each of the first electrodes;
    a bank configured to overlap a portion of the first electrode protective pattern so as to define an emission area;
    an organic light-emitting layer on each of the first electrodes so as to correspond to the emission area; and
    a second electrode on the organic light-emitting layer,
    wherein the first electrode protective pattern is directly located on a top and a side of the edge of each of the first electrodes,
    wherein the first electrode protective pattern extends from the side of the edge of each of the first electrodes so that an area between each of the first electrodes of the neighboring sub-pixels is filled with the first electrode protective pattern.

2. The device according to claim 1, wherein a region of the bank that overlaps the portion of the first electrode protective pattern is located on the first electrode protective pattern.

3. The device according to claim 1, wherein the first electrode protective pattern comprises two layers including a metal layer and a transparent metal oxide layer.

4. The device according to claim 3, wherein the metal layer is selected from Mo, Ti, Ta, an alloy of any one thereof, or a MoTi alloy.

5. The device according to claim 3, wherein the first electrode protective pattern includes an oxide semiconductor material.

6. The device according to claim 1, wherein the first electrode protective pattern overlaps each of the first electrodes further inward than the bank.

7. The device according to claim 6, wherein the bank includes:
    a first layer configured to overlap a portion of each of the first electrodes so that the area between each of the first electrodes of the neighboring sub-pixels is filled with the first layer; and
    a second layer on the first layer so as to correspond to the area between each of the first electrodes of the neighboring sub-pixels.

8. The device according to claim 7, wherein the first layer or the second layer is a light-shielding insulating material.

9. The device according to claim 7, wherein the first layer is a hydrophilic insulating material and the second layer is a hydrophobic insulating material.

10. The device according to claim 1, wherein the bank is provided so that an area between each of the first electrodes of the neighboring sub-pixels is filled with the bank.

* * * * *